United States Patent [19]

Ohtsuka et al.

[11] Patent Number: 5,027,166
[45] Date of Patent: Jun. 25, 1991

[54] HIGH VOLTAGE, HIGH SPEED SCHOTTKY SEMICONDUCTOR DEVICE AND METHOD OF FABRICATION

[75] Inventors: Koji Ohtsuka, Shiki; Yoshiro Kutsuzawa, Asaka; Kimio Ogata, Higashimatsuyama; Hideyuki Ichinosawa, Kunitachi, all of Japan

[73] Assignee: Sanken Electric Co., Ltd., Saitama, Japan

[21] Appl. No.: 277,333

[22] Filed: Nov. 29, 1988

[30] Foreign Application Priority Data

Dec. 4, 1987 [JP] Japan ................................ 62-307196

[51] Int. Cl.⁵ ...................... H01L 29/48; H01L 29/56
[52] U.S. Cl. .......................... 357/15; 357/52; 357/53
[58] Field of Search ...................... 357/15, 52, 53

[56] References Cited

U.S. PATENT DOCUMENTS

| | | | |
|---|---|---|---|
| 4,009,481 | 2/1977 | Reindl | 357/15 |
| 4,157,563 | 6/1979 | Bosselaar | 357/53 |
| 4,612,560 | 9/1986 | Dortu et al. | 357/15 |
| 4,626,884 | 12/1986 | Shannon | 357/30 |
| 4,646,115 | 2/1987 | Shannon et al. | 357/15 |
| 4,665,608 | 5/1987 | Okamoto et al. | 29/571 |
| 4,862,229 | 8/1989 | Mundy et al. | 357/15 |

OTHER PUBLICATIONS

S. M. Sze, "Physics of Semiconductor Devices", 1936, pp. 245-311.

*Primary Examiner*—Andrew J. James
*Assistant Examiner*—D. Monin
*Attorney, Agent, or Firm*—Woodcock Washburn Kurtz Mackiewicz & Norris

[57] ABSTRACT

A high voltage, high speed Schottky diode has an electrode of aluminum or like Schottky barrier metal formed on a semiconductor region to create a Schottky barrier therebetween. Also formed on the semiconductor region is a extremely thin resistive layer of, typically, oxidized titanium surrounding the barrier metal electrode and electrically connected thereto. The resistive layer also creates a Schottky barrier at its interface with the semiconductor region and serves to expand the depletion region due to the barrier metal electrode, thereby preventing the concentration of the electric field at the periphery of the barrier metal electrode and so enhancing the voltage withstanding capability of the diode.

19 Claims, 4 Drawing Sheets

HIGH VOLTAGE, HIGH SPEED SCHOTTKY SEMICONDUCTOR DEVICE AND METHOD OF FABRICATION

BACKGROUND OF THE INVENTION

Our invention relates to electronic devices in general and, in particular, to a Schottky semiconductor device and to a method of making such a device. The Schottky semiconductor device of our invention finds typical use as a diode well suited for high voltage applications.

The Schottky barrier diode, or the Schottky diode for short, is a kind of pn junction diode in which the barrier between two regions of opposite conductivity type produces the rectification. Lower power units are usually called semiconductor diodes, and the higher power units are usually called semiconductor rectifiers. The Schottky diode has found extensive usage in high frequency rectifier circuits and similar applications by virtue of its fast switching capability and low power loss. In some instances, however, these advantages have been offset by its susceptibility to surface breakdown. This weakness has generally been attributed to the markedly lower voltage withstanding capability of the Schottky diode at the periphepery of the Schottky barrier compared with that at the midportion of the barrier.

We are aware of some conventional solutions to the above problem. Typical of such solutions is the use of either metal field plates, known also as metal overlaps, or guard rings, or a combination of both. Reference may be had to pages 297-304 of *Physics of Semiconductor Devices*, second edition, by S. M. Sze for more details on various conventional metal semiconductor device structures.

Let us first study the prior art field plate Schottky diode. It has an n type semiconductor region overlying an n+ type semiconductor region and underlying an electrode of a metal capable of forming a Schottky barrier, this electrode being herein termed "barrier metal electrode". Also formed on the n type semiconductor region is an insulating layer surrounding the barrier metal electrode. The field plate is formed on the insulating layer in electric contact with the barrier metal electrode.

Upon application of a reverse voltage between the barrier metal electrode and an ohmic contact on the bottom of the n+ type semiconductor region, a depletion layer is created in the n type semiconductor region under the barrier metal electrode. Additionally, owing to the field effect of the field plate, another depletion layer is created in the n type semiconductor region in underlying relation to the field plate. The concentration of the electric field under the barrier metal electrode is thus prevented. However, the resulting improvement in the voltage withstanding capability at the periphery of the Schottky barrier has been limited and has not been so satisfactory as could be desired.

Next to be considered is the Schottky diode of the known guard ring design. It has, instead of the field plate, a p+ type semiconductor guard ring formed on the n type semiconductor region so as to surround and contact the barrier metal electrode. The guard ring creates a pn junction between itself and the n type semiconductor region. When subjected to a reverse voltage, the pn junction creates a depletion layer thereby improving the voltage withstanding capability of the diode at the periphery of the barrier metal electrode. Essentially, however, the guard ring diode can be thought of as a parallel arrangement of Schottky diode and pn junction diode. This arrangement gives rise to the injection of minority carriers at the pn junction when a forward current flows, thereby sacrificing the inherent fast response of the Schottky barrier diode.

SUMMARY OF THE INVENTION

We have hereby invented how to improve the voltage withstanding capabilities of Schottky semiconductor devices without sacrifice of their inherent high speed response, and how to fabricate such semiconductor devices of improved performance characteristics.

Briefly, our invention may be summarized as a high voltage, high speed Schottky semiconductor device comprising a barrier metal electrode, typically of aluminum, formed on a semiconductor region to create a Schottky barrier therebetween. Also formed on the semiconductor region is a resistive layer, as of oxidized titanium, surrounding the barrier metal electrode and electrically connected thereto. The resistive layer has a higher sheet resistance than the barrier metal electrode and is capable of creating an additional Schottky barrier at its interface with the semiconductor region.

Upon application of a reverse voltage between the barrier metal electrode and semiconductor region of the above summarized semiconductor device, there are created both a depletion layer due to the Schottky barrier at the interface between the barrier metal electrode and the semiconductor region and another depletion layer due to the Schottky barrier at the interface between the resistive layer and the semiconductor region. The two depletion layers are directly joined to each other if the resistive layer lies contiguous to the barrier metal electrode and, if a p+ type guard ring is provided around the electrode, via an additional depletion layer due to the pn junction offered by the guard ring. The united depletion layers function to prevent the concentration of the electric field at the periphery of the barrier metal electrode and hence to materially improve the overall voltage withstanding capability of the semiconductor device.

In a typical construction of the semiconductor device according to our invention, a succession of breakdowns occur at minute parts of the outer edge portion of the annular resistive layer upon application of a reverse voltage, resulting in the flow of reverse current through the resistive layer. Such the magnitude of the reverse current is limited by the inherent high resistivity of the resistive layer. The current flow from the outer toward the inner edge of the resistive layer creates a potential gradient across the resistive layer thereby providing a depletion layer effective to reduce the concentration of the electric field.

The above and other features and advantages of our invention and the manner of realizing them will become more apparent, and the invention itself will best be understood, from a study of the following description and appended claims, with reference had to the attached drawings showing the preferred embodiments of our invention.

DESCRIPTION OF THE PREFERRED EMBODIMENTS

Figure 1A:
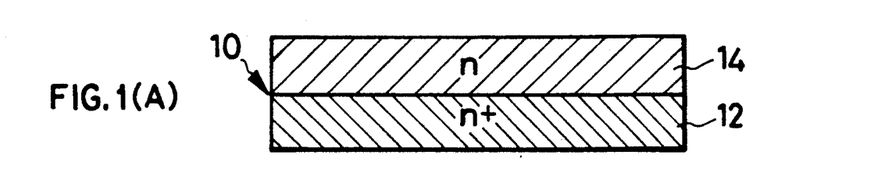
FIG. 1, consisting of (A)–(E), is a series of sectional views sequentially illustrating the steps of production of a Schottky diode embodying the principles of our invention.

We will first explain a typical method of making a Schottky power diode chip of typical construction in accordance with our invention. FIG. 1 shows at (A) through (E) the sequential steps of the method we adopted to make the typified Schottky diode. As illustrated in FIG. 1(A), the fabrication of the diode started with a substrate 10 of semiconducting material such as, typically, gallium arsenide (GaAs). The semiconductor substrate 10 was comprised of an n+ type region 12 and an n type region 14, the latter having being grown epitaxially on the former. The n+ type region 10 had a thickness of approximately 300 micrometers and an impurity concentration of 0.5 to $2.0 \times 10^{18}$ cm$^{-3}$. The n type epitaxial region 14 had a thickness of 10 to 20 micrometers and an impurity concentration of $2 \times 10^{15}$ cm$^{-3}$.

Figure 1B:
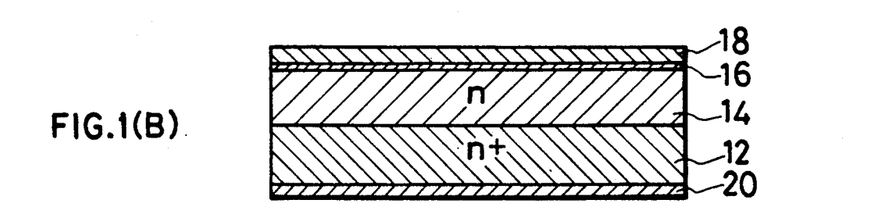

Then, as illustrated in FIG. 1(B), an extremely thin layer 16 of titanium (Ti) was vacuum deposited on the entire top surface of the n type region 14. A thicker layer 18 of aluminum (Al) was then vacuum deposited on the complete surface of the Ti layer 16. The Ti layer 16 was as thin as from 50 to 200 angstroms or tenthmeters (from 0.005 to 0.020 micrometers). The Al layer 18 was more than 100 times thicker, being approximately two micrometers.

FIG. 1(B) also shows an ohmic contact 20 formed by vacuum deposition on the bottom of the n+ type region 12. The FIG. 1(B) article was then heated to 380° C. and held at that temperature for about 10 seconds. The material of the ohmic contact 20 was an alloy of gold (Au) and germanium (Ge).

Figure 1C:
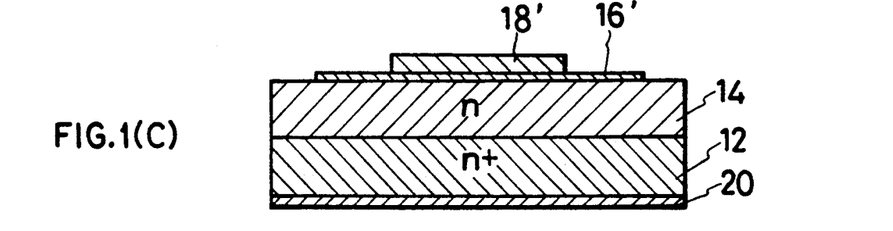

Subsequently, as illustrated in FIG. 1(C), all but a central part 18' of the Al layer 18 was photoetched away. Then all but a larger central part 16' of the underlying Ti layer 16 was likewise removed. Although Ti itself is conductive, the remaining Ti layer 16' was far more resistive than the remaining Al layer 18' by reason of its extreme thinness, having a sheet resistance of 20 to 400 ohms per square.

Figure 1D:
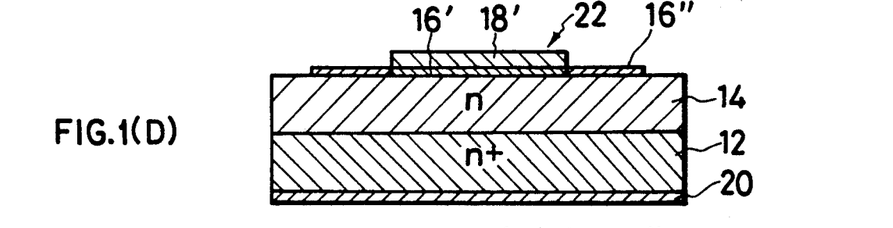

Then the FIG. 1(C) article was air heated to a temperature of 300° C. and maintained at that temperature for five to 30 minutes. FIG. 1(D) shows the resulting article, which is also illustrated in a top plan in FIG. 2. The heat treatment turned the exposed annular part of the Ti layer 16' into an oxidized Ti layer 16''. Underlying the Al layer 18' and being thereby masked, the other part of the Ti layer 16' remained practically unoxidized despite the heat treatment. Both Al and Ti are among the metals capable of forming Schottky barriers with GaAs. We will therefore refer to the combination of the Al layer 18' and the unoxidized Ti layer 16' as a barrier metal electrode and identify it by the reference numeral 22.

We are not certain of the individual contributions of the Al layer 18' and the unoxidized Ti layer 16' to the creation of the Schottky barrier, due in part to the extreme thinness of the latter. We have, however, confirmed by experiment that the Ti layer 16' contribute at least to the firm bonding of the Al layer 18' to the n type region 14, and to the establishment of good electrical connection between the annular oxidized Ti layer 16'' and the barrier metal electrode 22.

The sheet resistance of the barrier metal electrode 22 was 0.05 ohm per square. Generally, it should not exceed one ohm per square.

Figure 2:
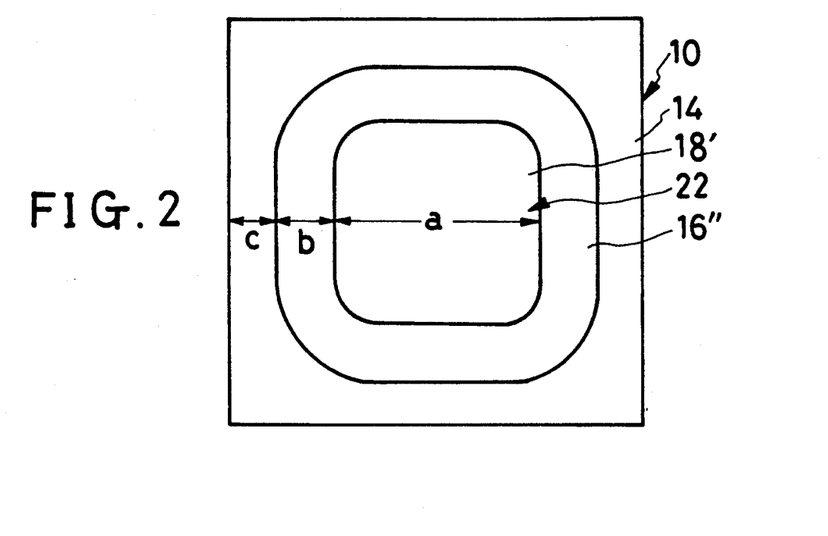
FIG. 2 is a top plan of the article of FIG. 1(D)

The oxidized Ti layer 16'' of FIGS. 1(D) and 2 grew thicker, to approximately 75 to 300 angstroms, than the unoxidized Ti layer 16' as a result of the heat treatment. Having a sheet resistance of as high as 50 to 500 megohms per square, the oxidized Ti layer 16'' proved to be semi-insulating rather than merely resistive. It is therefore reasoned that this layer 16'' is of definitely oxygen poor composition, namely, $TiO_x$, where x is a numeral less than two, instead of $TiO_2$ which may be considered a perfect insulator.

Figure 1E:
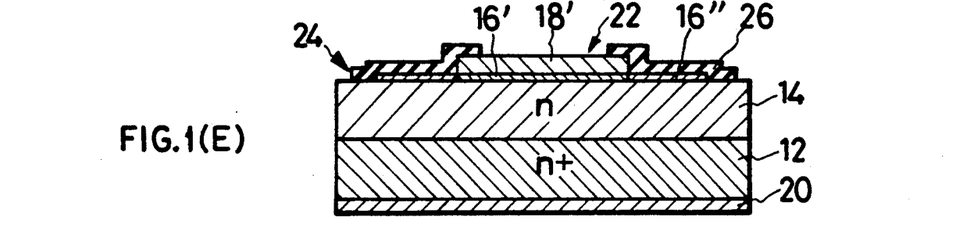

In FIG. 1(E) is shown the Schottky power diode chip 24 subsequently completed by forming an insulating layer 26 over the oxidized Ti layer 16''. The insulating layer 26 was a silicon oxide film formed by chemical vapor deposition (CVD). Alternatively, the insulating layer may be either a silicon nitride film formed by plasma or photo CVD, or a coating of polyimide resins. We recommend, however, silicon oxide layers made by plasma or photo CVD. Usually, Ti and Au layers, not shown, are formed successively on the Al layer 18' to provide a connection to a lead.

The dimension a, FIG. 2, of the barrier metal electrode 22 was approximately 900 micrometers; the dimension b of the oxidized Ti layer 16'' approximately 150 micrometers; and the dimension c of the exposed top surface portion of the n type region 14 approximately 150 micrometers.

We have ascertained by experiment that the voltage withstanding capability of the diode improves by making the dimension b of the Ti oxide layer 16'' approximately 10 micrometers or more, and more appreciably so by making that dimension more than 30 micrometers. However, for efficient fabrication of products having desired voltage withstanding capabilities, the design dimension b should not be less than 100 micrometers. There seems no definite upper limit to the dimension b since favorable results could be obtained even when we set the dimension at as much as 500 micrometers or even more. But the voltage withstanding capability did not improve proportionately when the dimension b was made more than 500 micrometers. Also, the resulting diode chips became inordinately large in size. Therefore, for all practical purposes, the dimension b should be in the range of 30–500 micrometers.

The Schottky diode 24 fabricated as in the foregoing is characterized by the presence of two Schottky barriers, one between the n type region 14 and the barrier metal electrode 22 and the other between the n type region 14 and the oxidized Ti layer 16''. We have confirmed the existence of the second mentioned Schottky barrier at the semiconductor-metal oxide interface from the differences in rectification characteristic, capacitance characteristic and saturation current arising from the presence or absence of the oxidized Ti layer 16". For instance, by preparing diode chips having no oxidized Ti layer 16" and having that layer of various surface areas, we have found that the saturation current increases approximately in proportion with the sum of the surface areas of the oxidized Ti layer and the barrier metal electrode 22. Such proportionality, which we have ascertained to exist at various operating temperatures of the diodes, means that a reverse current flows through the Ti oxide layer 16" at approximately the same current density as through the barrier metal electrode 22. We believe that this phenomenon evidences the fact that Schottky barriers of approximately the same height exist both under the barrier metal electrode 22 and under the oxidized Ti layer 16".

Figure 3:
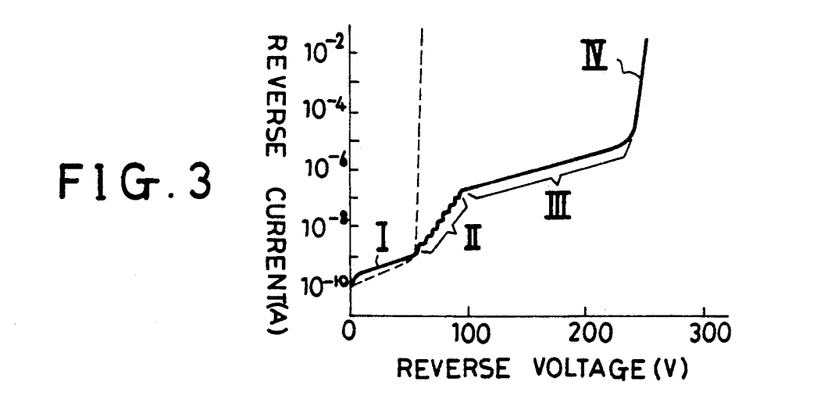
FIG. 3 is a graph plotting the reverse voltage-current characteristic of the Schottky diode of FIG. 1(E)

We have indicated the reverse voltage-current characteristic of the Schottky barrier diode 24 by the solid line in the graph of FIG. 3. The broken line in the same graph represents the reverse voltage-current characteristic of the prior art diode of the same construction as the inventive diode 24 except for the absence of the oxidized Ti layer 16". The curves show that the breakdown voltage of the inventive diode is as high as 250 volts whereas that of the prior art diode is only 60 volts. Obviously, the much higher breakdown voltage of the inventive diode is attributable to the oxidized Ti layer 16". We believe that the noted breakdown voltage of the inventive diode is approximately the same as the voltage blocked at the center of the barrier metal electrode 22.

We will analyze the reverse voltage-current characterictic of the Schottky diode 24, as represented by the solid line curve in FIG. 3, in more detail in order to make clear the nature and functions of the oxidized Ti layer 16". As indicated by the section I of the curve, a minute saturation current starts flowing as the reverse voltage gradually increases from zero. The reverse current flows not only through the barrier under the barrier metal electrode 22 but also through the barrier under the oxidized Ti layer 16". The circuit for the application of the reverse voltage is connected only to the barrier metal electrode (anode) 22 and to the ohmic contact (cathode) 20, but not directly to the oxidized Ti layer 16". Consequently, the current flowing through the oxidized Ti layer 16" flows into the barrier metal electrode 22. At the section I of the FIG. 3 curve the current flowing through the oxidized Ti layer 16" is of so little magnitude that there is hardly any difference in potential in the transverse direction of the oxidized Ti layer. The potential at any point on the oxidized Ti layer is approximately equal to that of the barrier metal electrode 22.

With an increase in the reverse voltage to 60–100 volts, breakdown takes place at limited parts of the periphery of the oxidized Ti layer 16", as manifested by the stepwise increase in reverse current at the section II of the FIG. 3 curve. Each step represents the breakdown of one limited part of the oxidized Ti layer. It will therefore be appreciated that unlike the prior art, the breakdown of any limited surface region does not trigger the flow of a large amount of reverse current in the diode of our invention. Obviously, this is due to the current limiting action of the highly resistive, or semi-insulating, property of the oxidized Ti layer.

Figure 4:
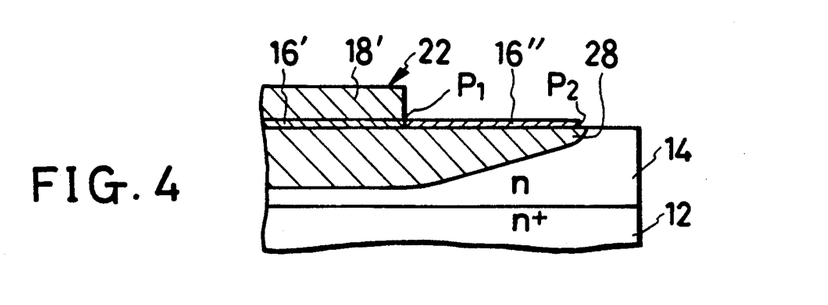
FIG. 4 is an enlarged, fragmentary section through the FIG. 1(D) article, showing in particular the depletion layer formed in the n type region.

Toward the end of the section II of the curve the potential difference between the inner and outer edges P1 and P2, FIG. 4, of the annular oxidized Ti layer 16" builds up to such a degree that the potential difference between the outer edge P2 of the oxidized Ti layer and the ohmic contact 20 becomes less responsive to an increase in the reverse voltage applied. No further breakdown occurs at the outer edge of the Ti oxide layer. However, the reverse current continues flowing through the oxidized Ti layer because of the breakdowns that have already taken place at its periphery.

Since no further breakdown occurs at the section III of the curve, the reverse current gradually increases that flows through the Schottky barriers under the barrier metal electrode 22 and under the oxidized Ti layer 16". Should the oxidized Ti layer 16" be of a material (e.g. highly resistive $n^-$ type GaAs) that creates no Schottky barrier, and that resistive layer be placed in ohmic contact with the barrier metal electrode 22, then the reverse current (leakage current) would increase materially with an increase in reverse voltage, resulting in a decrease in the voltage withstanding capability of the diode. Not only being extremely resistive but also being capable of forming a Schottky barrier, the oxidized Ti layer of our invention can reduce the amount of leakage current far more effectively than the merely resistive layer.

We have indicated by the hatching designated 28 in FIG. 4 the depletion layer formed under both the barrier metal electrode 22 and the oxidized Ti oxide layer 16" as a result of voltage application thereto. As the potential difference between the oxidized Ti layer 16" and the $n^+$ type region 12 decreases from the inside edge P1 toward the outside edge P2 of the oxidized Ti layer, so does the thickness or depth of the depletion layer 28. It will also be seen that the Schottky barrier exists continually at the surface portion of the n type region 23 underlying both the barrier metal electrode 22 and the oxidized Ti layer 16". As a result of these facts there can be obtained the depletion layer 28 of smoothly varying depth under the barrier metal electrode 22 and the oxidized Ti layer 16". This depletion layer 28 serves to prevent the concentration of the electric field at the periphery of the barrier metal electrode 22. Therefore, as represented by the section III of the FIG. 3 curve, no surface breakdown takes place in the face of an increase in the reverse voltage over the wide range.

With an increase in the reverse voltage to 250 volts or so the critical electric field is exceeded somewhere between the ohmic electrode 20 and the barrier metal electrode 22. A sudden increase in the reverse current, exhibited by the section IV of the curve, indicates the occurrence of breakdown.

We have further tested the need for the oxidation of the Ti layer 16' of the FIG. 1(C) article by measuring its reverse voltage-current characteristic before the oxidizing treatment. The tested diode was incapable of controlling the reverse current as at the section II of the FIG. 3 curve, obviously by reason of the lack of resistivity of the Ti layer 16'. Breakdown took place approximately as represented by the broken line prior art curve of FIG. 3. No significant difference in forward voltage-current characteristic could be observed, either, between the tested diode and the prior art diodes having no oxidized Ti layer 16".

We put the Schottky diode 24 of the FIG. 1(E) configuration to use as a rectifier in a 500 kHz switching regulator. The diode provided rectification with little or no noise production. Nor could any reduction in switching speed due to the presence of the oxidized Ti layer 16" be observed.

The advantages gained by the Schottky diode 24 of our invention and by the method of its fabrication may be summarized as follows:

1. Being resistive and capable of creating a Schottky barrier at its interface with the n type region, the oxidized Ti layer 16" serves to form the depletion layer effective to prevent the concentration of the electric field at the periphery of the barrier metal electrode, thereby contributing to the higher voltage withstanding capability of the diode.

2. Faster response is obtained than the prior art Schottky diode having the guard ring.

3. No such instability in voltage withstanding capability at elevated temperatures is present as that of the prior art Schottky diode having the field plate attached via an insulating layer.

4. The oxidized Ti layer 16" is easily formed by oxidizing the exposed annular part of the Ti layer 16', FIG. 1(C), of larger size than the overlying Al layer 18'.

5. The unoxidized Ti layer underlying the Al layer 18' realizes easy and positive electrical connection between the oxidized Ti layer 16" and the barrier metal electrode 22.

Second Form

Figures 5, 6:
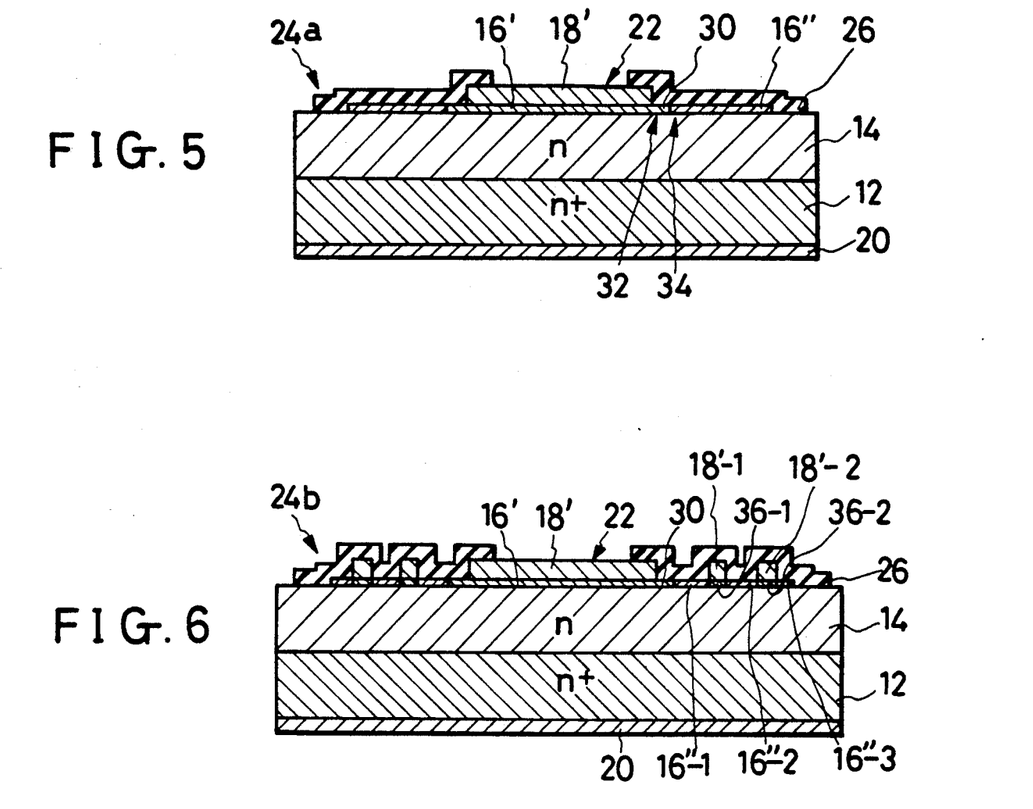
FIG. 5 is a section through another preferred form of Schottky diode of our invention.
FIG. 6 is a section through still another preferred form of Schottky diode of our invention.

FIG. 5 illustrates another preferred form of Schottky diode 24a in accordance with our invention. In this and additional embodiments of our invention to be disclosed subsequently, we will identify the parts by the same reference characters as those used to denote the corresponding parts, if any, of the FIG. 1(E) diode 24 and dispense with the description of such common parts.

The alternative diode 24a of FIG. 5 differs from the FIG. 1(E) diode 24 in that the unoxidized Ti layer 16' has an annular outstretch 30 extending beyond the outer edges of the overlying Al layer 18'. Consequently, the oxidized Ti layer 16" is not in direct contact with the Al layer 18' but via the annular outstretch 30 of the unoxidized Ti layer 16'. This annular Ti outstretch 30 can be formed by photoetching away an annular peripheral portion of the Al layer 18' of the FIG. 1(D) article after the oxidizing heat treatment of the part 16" of the Ti layer.

The annular outstretch 30 is merely part of the unoxidized Ti layer 16' and can form a Schottky barrier at its interface with the n type region 14. Therefore, this outstretch may be thought of as part of the barrier metal electrode 22. The FIG. 5 diode 24a is identical with the FIG. 1(E) diode 24 in the other details of construction.

It is the purpose of the Ti outstretch 30 of the FIG. 5 diode 24a to enable the diode 24a to withstand higher voltages than does the FIG. 1(E) diode 24. Since the Al layer 18' and the n type region 14 are of heterogenous materials, the fabrication of the Al layer on the n type region causes the concentration of stress just under the periphery of the Al layer, as indicated at 32 in FIG. 5. The critical electric field at which breakdown occurs is lower at the part 32 than at the other parts. The concentration of the field at this part 32 of the diode would make it more susceptible to breakdown. The Ti outstretch 30 serves to distance the inside edge of the oxidized Ti layer 16" away from the periphery of the Al layer 18'.

As will be understood by referring to FIG. 1(E) again, the diode 24 tends to invite field concentration under the boundary between the barrier metal electrode 22 and the oxidized Ti layer 16". Contrastively, in the FIG. 5 diode 24a, field concentration takes place at 34, that is under the interface between the highly resistive oxidized Ti layer 16" and the more conductive Ti outstretch 30. Thus, as the region 34 of field concentration is distanced from the region 32 of stress concentration, the FIG. 5 diode 24a can withstand higher voltages than the FIG. 1(E) diode 24.

Third Form

Still another preferred form of Schottky diode 24b shown in FIG. 6 features the concentric arrangement, in place of the Ti oxide layer 16" of the FIG. 5 diode 24a, of three annular oxidized Ti layers or regions 16"-1, 16"-2 and 16"-3 and, disposed alternately therewith, two annular unoxidized Ti regions 36-1 and 36-2. All these regions are electrically coupled to one another. Additionally, two annular Al regions 18'-1 and 18'-2 overlie the Ti regions 36-1 and 36-2, respectively. The Al regions 18'-1 and 18'-2 are parts of the Al layer 18 of the FIG. 1(B) article, which have been left on the Ti layer 16 together with the central Al region 18' at the time of the photoetching of the Al layer 18. The remaining Al regions 18'-1 and 18'-2 serve in turn to mask the underlying Ti regions 36-1 and 36-2 during the oxidation of the exposed annular regions 16"-1–16"-3.

The unoxidized Ti regions 36-1 and 36-2 and the overlying Al regions 18'-1 and 18'-2 serve, by virtue of their relatively high conductivity, to equalize the distribution of potentials on the top surface of the n type region 14. Such equal potential distribution is effective to create a depletion layer of constant depth and hence to enable the diode 24b to withstand higher voltages.

Despite the showing of FIG. 6 the annular Al regions 18'-1 and 18'-2 may be dispensed with. For the unoxidized Ti regions 36-1 and 36-2 are sufficiently conductive to serve the purpose of potential equalization by themselves. Alternatively, the Ti regions 36-1 and 36-2 may be oxidized like the neighboring oxidized Ti regions 16"-1–16"-3, and the regions 18'-1 and 18'-2 of Al or other conductive material may be used for potential equalization. As a further alternative, $p^+$ type regions similar to the prior art guard rings may be provided under the Ti regions 36-1 and 36-2 as primary or supplementary means for potential equalization. It will also be apparent that instead of the two potential equalizing rings shown in FIG. 6, only one or three or more such rings may be provided.

Fourth Form

Figure 7:
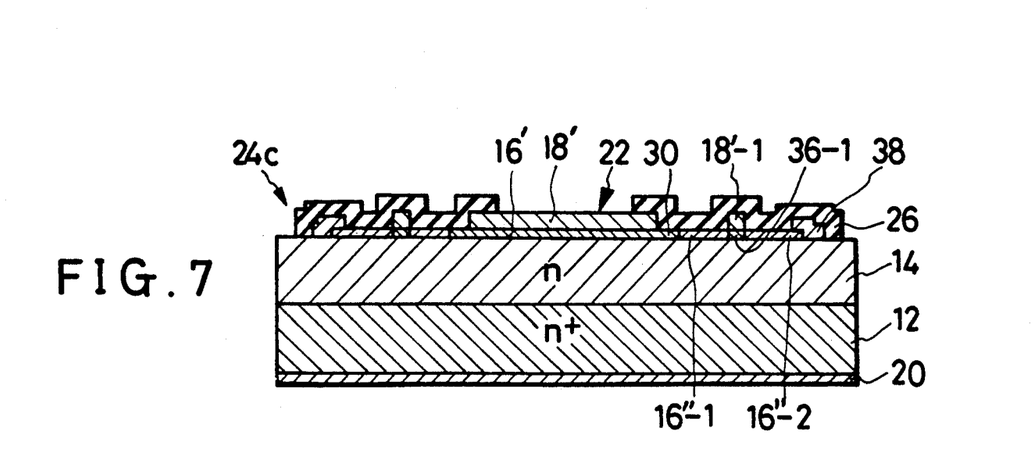
FIG. 7 is a section through a further preferred form of Schottky diode of our invention.

FIG. 7 shows a further preferred form of Schottky diode 24c in accordance with our invention. This diode 24c has but two annular oxidized Ti regions 16"-1 and 16"-2 and the intervening unoxidized Ti region 36-1 together with the overlying Al region 18'-1, which concentrically surround the barrier metal electrode 22 of the same construction as in the foregoing embodiments. A feature of this diode 24c resides in an annular shorting electrode 38 electrically interconnecting the n type region 14 and the outer oxidized Ti region 16"-2. Typically, the shorting electrode 38 is a lamination of a lowermost Au-Ge layer, an Ni layer thereon, and a topmost Au layer and is in ohmic contact with the GaAs n type region 14.

Upon application of a reverse voltage to the diode 24c, the shorting electrode 38 functions to make the potential of the outer edge of the outer oxidized Ti region 16"-2 approximately equal to that of the n type region 14 thereby protecting the outer oxidized Ti region against breakdown. We have confirmed that this diode 24c does not generate any such noise as may be produced by the FIG. 1(E) diode 24 during its operation at the section II of the FIG. 3 curve. Since the shorting electrode 38 provides a current path, the current will flow through the shorting electrode 38, outer oxidized Ti region 16"-2, Ti region 36-1, inner oxidized Ti region 16"-1 and barrier metal electrode 22.

Fifth Form

Figure 8:
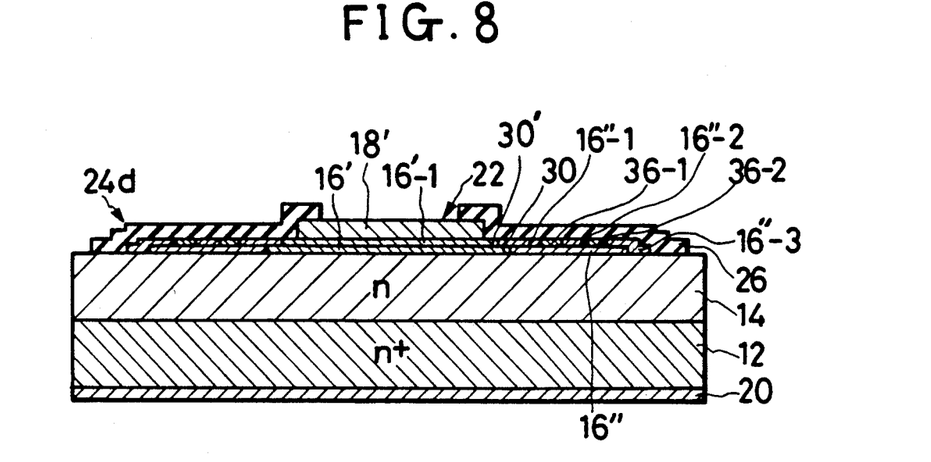
FIG. 8 is a section through a further preferred form of Schottky diode of our invention.

In FIG. 8 is shown a further preferred form of Schottky diode 24d, in which an annular oxidized Ti region 16" of relatively large surface area is formed directly on the top surface of the n type region 14 as in the FIG. 5 diode 24a. Formed on the Ti oxide layer 16" are a concentric arrangement of three annular oxidized Ti regions 16"-1, 16"-2 and 16"-3 and, disposed alternately therewith, two annular unoxidized Ti regions 36-1 and 36-2 for potential equalization. The annular oxidized Ti regions 16"-1–16"-3 are formed by selective oxidation of a Ti layer which immediately underlies the Al layer 18' and of which the unoxidized Ti regions 36-1 and 36-2 are parts. This additional Ti layer further includes a centeral portion 16'-1 underlying the Al layer 18' and having an annular outstretch 30'.

Although the two stacked Ti layers are of approximately the same thickness, the region 16" of the lower Ti layer is oxidized to a greater degree, and so has a higher sheet resistance, than the regions 16"-1–16"-3 of the upper Ti layer. Consequently, current is easier to flow through the oxizied Ti regions 16"-1–16"-3 and unoxidized Ti regions 36-1 and 36-2 of the upper Ti layer than through the oxidized Ti region 16" of the lower Ti layer. It is therefore primarily the upper Ti layer that determines the potential gradient. Since the oxidized Ti region 16" of the lower Ti layer provides a high barrier height, there can be provided a diode of low saturation current; that is, the magnitude of the reverse current at the sections I, II and III of the FIG. 3 curve can be reduced.

The outermost oxidized Ti region 16"-3 of the diode 24d may be either in contact, as shown, or out of contact with the n type region 14. As an additional modification of the illustrated configuration of the diode 24d, the oxidized Ti region 16" of the lower Ti layer may also be provided with annular unoxidized Ti regions for potential equalization. Also, the annular Al regions 18'-1 and 18'-2 of FIG. 6 may be formed on the unoxidized Ti regions 36-1 and 36-2 of the upper Ti layer.

Sixth Form

Figure 9:
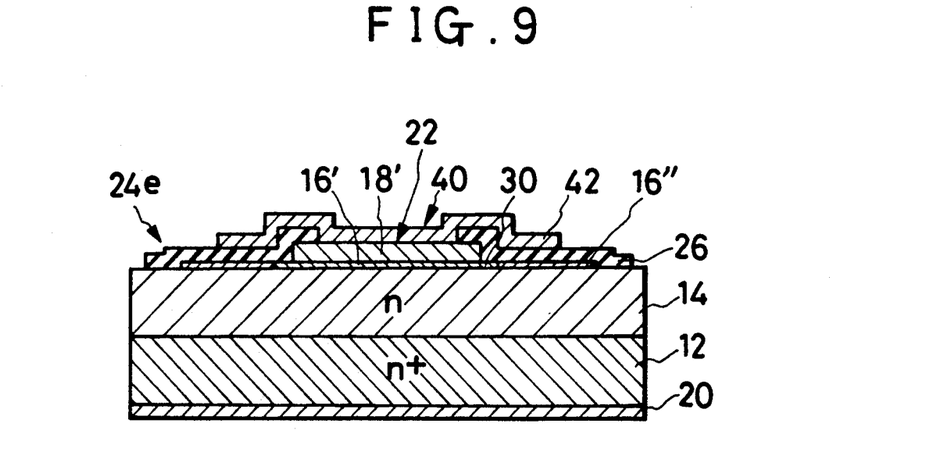
FIG. 9 is a section through a still further preferred form of Schottky diode of our invention.

With reference to FIG. 9 a still further preferred form of Schottky diode 24e illustrated therein is identical in construction with the FIG. 5 diode 24a except for an electrode layer 40 formed by vacuum deposition on the barrier metal electrode 22 and on part of the insulating layer 26. The electrode layer 40 functions as a field plate as its periphery 42 lies opposite the n type region 14 via the insulating layer 26 and the annular oxidized Ti region 16". Thus the voltage withstanding capability of the diode 24e is dually improved both by the oxidized Ti region 16" and by the field plate 40.

Generally, in the fabrication of the diodes of various configurations set forth hereinbefore, the sheet resistances of the Ti oxide regions 16", 16"-1–16"-3 should be in the range of 10 kilohm–5000 megohm per square, preferably 10–1000 megohm per square, depending in part upon the particular chip construction and size adopted.

The thickness of the Ti layer 16, FIG. 1(B), should be not less than 20 angstroms in consideration of the ease of production and the temperature and time of subsequent oxidation. There is no particular upper limit as long as the above specified range of sheet resistance is obtainable. However, if the Ti layer is to be thermally oxidized, the thickness should not exceed 300 angstroms in consideration of the temperature and time of the oxidation. The upper limit can be higher if the Ti layer is to be strongly oxidized by plasma.

The oxidation temperature of the Ti layer 16 should be less than 500° C., and 380° C. in the use of Au electrodes. The lower limit of the oxidation temperature may be 200° C. in the case of thermal oxidation and may be as low as room temperature in the case of plasma oxidation. The oxidation time, although subject to change depending upon the thickness of the Ti layer 16 and the temperature and atmosphere of oxidation, should be in the range of five seconds to two hours.

Possible Modifications

We do not wish our invention to be limited by the exact details of the foregoing disclosure. A variety of modifications or alterations of the illustrated embodiments may be resorted to without departing from the scope of our invention. The following is a brief list of such possible modifications or alterations:

1. The oxidized Ti regions 16", 16"-1–16"-3 could be formed by the vapor deposition or sputtering of a Ti oxide, instead of by the oxidation of Ti films, and the unoxidized Ti regions 30, 36-1, 36-2, etc., could be replaced by nitrided Ti regions of relatively high conductivit. Such regions might be formed by nitriding the Ti layer through the Al masking.

2. Although oxidized Ti is well suited for production of films having high sheet resistance and capable of creating Schottky barriers, there could also be employed oxides of other materials such as those containing tantalum.

3. Additives such as indium and tin could be admixed with Ti for the production of the various Ti regions, both oxidized and unoxidized.

4. Guard rings of p+ type may be incorporated with the semiconductor devices of our invention. For example, in the case of the FIG. 5 diode 24a, a guard ring may be formed in the n type region 14 so as to extend along the annular boundary between the Ti outstretch 30 and the oxidized Ti region 16". The guard ring may be held disconnected from the Al region 18'. The fast response of the diode 24a will not deteriorate as hardly any forward current will flow into the p+ type guard ring because of the resistivity of the Ti outstretch 30. Although no Schottky barrier is created between the p+ type guard ring and the oxidized Ti region 16" or between the guard ring and the barrier metal electrode, a depletion region is formed instead due to the pn junction between the guard ring and the n type region 14. This depletion layer joins with the depletion layer due to the barrier metal electrode 22, with the consequent improvement in the voltage withstanding capability of the diode.

5. The principles of our invention may be applied not only to GaAs semiconductor devices but also to those made of other substances such as silicon, indium phosphide or like compounds of the elements of Groups III-V of the Periodic Table.

6. In producing Schottky semiconductor devices of our invention as parts of integrated circuits, the planar configuration may be employed such that the n+ type region completely surrounds the n type region, with the ohmic contact provided on the top surface of the device.

7. The n and n+ type regions may be replaced by p and p+ type regions.

What we claim is:

1. A high voltage, high speed Schottky semiconductor device comprising:
   (a) a semiconductor region;
   (b) a barrier metal electrode formed on the semiconductor region to create a Schottky barrier therebetween; and
   (c) a resistive layer formed on the semiconductor region so as to surround the barrier metal electrode and electrically connected to the barrier metal electrode, the resistive layer having a higher sheet resistance than the barrier metal electrode and being capable of creating a Schottky barrier between the resistive layer and the semiconductor region, the sheet resistance of the resistive layer being from 10 kilohms to 5000 megohms.

2. The Schottky semiconductor device of claim 1 wherein the resistive layer is of oxidized titanium.

3. The Schottky semiconductor device of claim 2 wherein the barrier metal electrode comprises a first layer of unoxidized titanium formed on the semiconductor region, and a second layer of a different metal formed on the first layer, and wherein the first layer is integrally joined to the resistive layer.

4. The Schottky semiconductor device of claim 3 wherein the first layer of the barrier metal electrode has an annular peripheral portion not covered with the second layer.

5. The Schottky semiconductor device of claim 3 wherein the second layer of the barrier metal electrode is of aluminum.

6. The Schottky semiconductor device of claim 2 wherein the semiconductor region is of gallium arsenide.

7. The Schottky semiconductor device of claim 1 further comprising an insulating layer formed on the resistive layer.

8. The Schottky semiconductor device of claim 7 wherein the insulating layer is of silicon oxide.

9. The Schottky semiconductor device of claim 7 further comprising a field plate formed on the insulating layer and electrically coupled to the barrier metal electrode.

10. The Schottky semiconductor device of claim 1 further comprising:
    (a) a second semiconductor region joined to the first recited semiconductor region and having an impurity concentration higher than that of the first semiconductor region; and
    (b) an ohmic contact formed on the second semiconductor region.

11. A high voltage, high speed Schottky semiconductor device comprising:
    (a) a semiconductor region;
    (b) a barrier metal electrode comprising a layer of unoxidized titanium formed on the semiconductor region, and another layer of a different metal formed on the unoxidized titanium layer;
    (c) a first oxidized titanium region formed on the semiconductor region and creating a Schottky barrier therebetween, the first oxidized titanium region surrounding the unoxidized titanium layer of the barrier metal electrode and electrically coupled thereto;
    (d) a potential equalizing metal region formed on the semiconductor region and surrounding the first oxidized titanium region, the potential equalizing metal region being electrically coupled to the first oxidized titanium region; and
    (e) a second oxidized titanium region formed on the semiconductor region and creating a Schottky barrier therebetween, the second oxidized titanium region surrounding the potential equalizing metal region and electrically coupled thereto.

12. The Schottky semiconductor device of claim 11 wherein the potential equalizing metal region is of unoxidized titanium.

13. The Schottky semiconductor device of claim 11 wherein the potential equalizing metal region comprises:
    (a) a layer of unoxidized titanium formed on the semiconductor region; and
    (b) a layer of aluminum formed on the unoxidized titanium layer.

14. The Schottky semiconductor device of claim 11 further comprising a shorting electrode extending along the periphery of the second oxidized titanium region and electrically connecting the second oxidized titanium region to the semiconductor region.

15. A high voltage, high speed Schottky semiconductor device comprising:
    (a) a semiconductor region;
    (b) a barrier metal electrode formed on the semiconductor region to create a Schottky barrier therebetween, the barrier metal electrode comprising a first layer of unoxidized titanium in direct contact with the semiconductor region, a second layer of unoxidized titanium formed on the first unoxidized titanium layer, and a third layer of a different metal formed on the second unoxidized titanium layer;
    (c) a first oxidized titanium region formed on the semiconductor region and creating a Schottky barrier therebetween, the first oxidized titanium region surrounding the first unoxidized titanium layer of the barrier metal electrode and electrically coupled thereto; and
    (d) a second oxidized titanium region formed on the first oxidized titanium region and surrounding the second unoxidized titanium layer of the barrier metal electrode, the second oxidized titanium region being electrically coupled to the second unoxidized titanium layer of the barrier metal electrode and having a sheet resistance less than the sheet resistance of the first oxidized titanium region.

16. A high voltage, high speed Schottky semiconductor device comprising:
    (a) a semiconductor region;
    (b) a barrier metal electrode formed on the semiconductor region to create a Schottky barrier therebetween, the barrier metal electrode comprising a first layer of a metal formed on the semiconductor region and a second layer of a different metal formed on the first layer, the first layer having an annular peripheral portion not covered with the second layer; and
    (c) a resistive layer formed on the semiconductor region so as to surround the first layer of the barrier metal electrode and electrically connected to the first layer of the barrier metal electrode, the resistive layer having a higher sheet resistance than the barrier metal electrode and being capable of creating a Schottky barrier between the resistive layer and the semiconductor region.

17. The Schottky semiconductor device of claim 16 wherein the first layer of the barrier metal electrode is of titanium and the resistive layer is of oxidized titanium.

18. A high voltage, high speed Schottky semiconductor device comprising:
 (a) a semiconductor region;
 (b) a barrier metal electrode formed on the semiconductor region to create a Schottky barrier therebetween;
 (c) a resistive layer formed on the semiconductor region so as to surround the barrier metal electrode and electrically connected to the barrier metal electrode, the resistive layer having a higher sheet resistance than the barrier metal electrode and being capable of creating a Schottky barrier between the resistive layer and the semiconductor region;
 (d) an insulating layer formed on the resistive layer; and
 (e) a field plate formed on the insulating layer and electrically connected to the barrier metal electrode.

19. A high voltage, high speed Schottky semiconductor device comprising:
 (a) a semiconductor region;
 (b) a barrier metal electrode formed on the semiconductor region to create a Schottky barrier therebetween;
 (c) a first resistive layer formed on the semiconductor region so as to surround the barrier metal electrode and electrically connected to the barrier metal electrode, the first resistive layer having a higher sheet resistance than the barrier metal electrode and being capable of creating a Schottky barrier between the first resistive layer and the semiconductor region;
 (d) a potential equalizing metal region formed on the semiconductor region and surrounding the first resistive layer, the potential equalizing metal region being electrically connected to the first resistive layer; and
 (e) a second resistive layer formed on the semiconductor region so as to surround the potential equalizing metal region and electrically connected to the potential equalizing metal region, the second resistive layer having a higher sheet resistance than the barrier metal electrode and being capable of creating a Schottky barrier between the second resistive layer and the semiconductor region.

* * * * *